US010613576B2

(12) United States Patent
Toriumi et al.

(10) Patent No.: US 10,613,576 B2
(45) Date of Patent: Apr. 7, 2020

(54) OSCILLATOR, CLOCK SIGNAL GENERATOR, ELECTRONIC APPARATUS, AND VEHICLE

(71) Applicant: Seiko Epson Corporation, Tokyo (JP)

(72) Inventors: Yuichi Toriumi, Cupertino, CA (US); Hisahiro Ito, Minowa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/225,462

(22) Filed: Dec. 19, 2018

(65) Prior Publication Data

US 2019/0196531 A1 Jun. 27, 2019

(30) Foreign Application Priority Data

Dec. 27, 2017 (JP) ................. 2017-252089

(51) Int. Cl.
*G06F 1/08* (2006.01)
*H03L 7/085* (2006.01)
*H03L 7/081* (2006.01)
*H03K 3/03* (2006.01)
*G01R 31/317* (2006.01)
*H03L 7/099* (2006.01)

(52) U.S. Cl.
CPC ......... *G06F 1/08* (2013.01); *G01R 31/31727* (2013.01); *H03K 3/03* (2013.01); *H03L 7/085* (2013.01); *H03L 7/0812* (2013.01); *H03L 7/099* (2013.01)

(58) Field of Classification Search
CPC ..... H03L 7/085; H03L 7/0805; H03L 7/0807; H03L 7/0812; H03L 7/083; H03L 7/087; H03L 7/099; H03L 7/0991; G06F 1/08; G06F 1/324; G06F 11/004; G06F 1/06; G06F 1/10; G01R 31/31727
See application file for complete search history.

(56) References Cited

U.S. PATENT DOCUMENTS

| 7,292,114 | B2* | 11/2007 | Greenberg | ............. H03B 5/364 331/116 FE |
| 8,860,482 | B1* | 10/2014 | Liu | ........................ H03L 7/099 327/148 |
| 10,418,941 | B2* | 9/2019 | Kumar | ...................... H03B 5/06 |
| 2007/0001774 | A1* | 1/2007 | Stevenson | ................. G06F 1/06 331/158 |
| 2007/0146083 | A1* | 6/2007 | Hein | ....................... H03L 1/022 331/16 |
| 2013/0307713 | A1* | 11/2013 | Kawaguchi | ............. H03M 1/50 341/166 |

(Continued)

FOREIGN PATENT DOCUMENTS

JP 10-020961 A 1/1998

*Primary Examiner* — Khanh C Tran

(74) *Attorney, Agent, or Firm* — Harness, Dickey & Pierce, P.L.C.

(57) ABSTRACT

An oscillator includes a circuit device, a clock output terminal, an error output terminal via which an error signal is outputted, and a clock input terminal, and the circuit device includes a clock signal generation circuit that generates a clock signal, an error signal generation circuit that generates the error signal, and a selection circuit that selects one of the clock signal and a signal inputted via the clock input terminal based on the error signal and outputs the selected signal via the clock output terminal.

12 Claims, 6 Drawing Sheets

(56) References Cited

U.S. PATENT DOCUMENTS

| | | | |
|---|---|---|---|
| 2015/0061786 A1* | 3/2015 | Mai | H03B 5/364 |
| | | | 331/116 FE |
| 2017/0194971 A1* | 7/2017 | Yonezawa | H03L 7/095 |
| 2017/0250681 A1* | 8/2017 | Gaspard | G11C 11/00 |

* cited by examiner

| OE/XST(=OE) | OSCILLATION STATE | ERR | OUT |
|---|---|---|---|
| L | NORMAL | L | L |
| L | ABNORMAL | H | L |
| H | NORMAL | L | GENERATED CLOCK SIGNAL |
| H | ABNORMAL | H | SIGNAL INPUTTED VIA CLKIN |

| OE/XST(=XST) | OSCILLATION STATE | ERR | OUT |
|---|---|---|---|
| L | – | L | L |
| H | NORMAL | L | GENERATED CLOCK SIGNAL |
| H | ABNORMAL | H | SIGNAL INPUTTED VIA CLKIN |

OSCILLATOR, CLOCK SIGNAL GENERATOR, ELECTRONIC APPARATUS, AND VEHICLE

BACKGROUND

1. Technical Field

The present invention relates to an oscillator, a clock signal generator, an electronic apparatus, and a vehicle.

2. Related Art

As a multiplexed system that requires high reliability, JP-A-10-20961, for example, describes a computer apparatus that operates as follows: Signals from clock signal sources that are a plurality of oscillators are divided with a plurality of dividers; clock signals outputted by the plurality of dividers are counted with a plurality of counters; the counts from the plurality of counters are compared with one another with comparators; and a normal clock signal is selected and sent based on the result of the comparison.

The computer apparatus described in JP-A-10-20961, however, needs to not only incorporate the oscillators but compare the oscillators with one another in the computer apparatus and determine and select a normal clock signal, resulting in a problem of difficulty in reducing the size of the apparatus and reducing the cost thereof. The problem results from poor user convenience of using the oscillators.

SUMMARY

An advantage of some aspects of the invention is to provide an oscillator that can be multiplexed and excels in user convenience. Another advantage of some aspects of the invention is to provide a clock signal generator using the oscillator that can be multiplexed and excels in user convenience. Another advantage of some aspects of the invention is to provide an electronic apparatus and a vehicle using the clock signal generator.

The invention can be implemented as the following embodiments or application examples.

APPLICATION EXAMPLE 1

An oscillator according to this application example includes a circuit device, a clock output terminal, an error output terminal via which an error signal is outputted, and a clock input terminal, and the circuit device includes a clock signal generation circuit that generates a clock signal, an error signal generation circuit that generates the error signal, and a selection circuit that selects one of the clock signal and a signal inputted via the clock input terminal based on the error signal and outputs the selected signal via the clock output terminal.

In the oscillator according to this application example, the clock signal generated by the clock signal generation circuit is switched to the signal inputted via the clock input terminal or vice versa in accordance with whether or not an error has occurred in the oscillator. Therefore, for example, using two oscillators according to the present application example to electrically connect the clock input terminal of a first oscillator to the clock output terminal of a second oscillator allows achievement of an apparatus that outputs the clock signal generated by the second oscillator via the clock output terminal of the first oscillator when an error occurs in the first oscillator. Therefore, according to the present application example, an oscillator that can be multiplexed and excels in user convenience can be provided.

APPLICATION EXAMPLE 2

In the oscillator according to the application example described above, the clock signal generation circuit may include an oscillation circuit that outputs an oscillation signal from which the clock signal is generated, the circuit device may include an amplitude detection circuit that detects an amplitude of the oscillation signal, and the error signal generation circuit may generate the error signal based on a result of the detection performed by the amplitude detection circuit.

The oscillator according to this present application example can sense abnormality in the clock signal generation circuit based on the amplitude of the oscillation signal outputted by the oscillation circuit and automatically switch the signal outputted via the clock output terminal to another.

APPLICATION EXAMPLE 3

In the oscillator according to the application example described above, the error signal generation circuit may compare the result of the detection performed by the amplitude detection circuit with a threshold and generate the error signal based on a result of the comparison, and the threshold may be variable.

The oscillator according to this application example can adjust the threshold for generating the error signal in accordance with the characteristics of the oscillation circuit and can therefore accurately sense abnormality in the clock signal generation circuit to switch the signal outputted via the clock output terminal to another.

APPLICATION EXAMPLE 4

In the oscillator according to the application example described above, the circuit device may include a current detection circuit that detects current flowing through the clock signal generation circuit, and the error signal generation circuit may generate the error signal based on a result of the detection performed by the current detection circuit.

In the oscillator according to this application example, the error signal generation circuit may compare the result of the detection performed by the current detection circuit with a threshold and generate the error signal based on a result of the comparison, and the threshold may be variable.

The oscillator according to this application example can sense abnormality in the clock signal generation circuit based on the current flowing through the clock signal generation circuit and automatically switch the signal outputted via the clock output terminal to another.

APPLICATION EXAMPLE 5

The oscillator according to the application example described above may further include a control terminal to which a control signal that controls signal output via the clock output terminal is inputted.

According to this application example, an oscillator that can control the signal output via the clock output terminal and excels in user convenience can be provided. Further, for example, using two oscillators according to the present application example to electrically connect the clock input terminal of a first oscillator to the clock output terminal of a second oscillator and electrically connecting the error output terminal of the first oscillator to the control terminal of the second oscillator allows the following apparatus to be achieved: No clock signal is outputted via the clock output terminal of the second oscillator until an error occurs in the first oscillator to reduce electric power consumed by the second oscillator; and the clock signal generated by the second oscillator is outputted via the clock output terminal of the first oscillator when an error occurs in the first oscillator. Therefore, according to the present application example, an oscillator that can be multiplexed and excels in user convenience can be provided.

APPLICATION EXAMPLE 6

In the oscillator according to the application example described above, the circuit device may have a first edge and a second edge that faces away from the first edge, the clock input terminal may be provided along the first edge, and the clock output terminal may be provided along the second edge.

The oscillator according to this application example, in which the clock input terminal and the clock output terminal are provided in positions separate from each other, can lower the probability of a short circuit between the clock input terminal and the clock output terminal due, for example, to entry of foreign matter. The oscillator according to the present application example can therefore suppress concern of formation of a loop along which the signal outputted via the clock output terminal returns via the clock input terminal followed by output of a wrong signal via the clock output terminal.

APPLICATION EXAMPLE 7

A clock signal generator according to this application example includes a first oscillator a second oscillator. The first oscillator includes a first circuit device, a first clock output terminal, a first error output terminal via which a first error signal is outputted, and a first clock input terminal, and the first circuit device includes a first clock signal generation circuit that generates a first clock signal, a first error signal generation circuit that generates the first error signal, and a first selection circuit that selects one of the first clock signal and a signal inputted via the first clock input terminal based on the first error signal and outputs the selected signal via the first clock output terminal. The second oscillator includes a second circuit device, a second clock output terminal, a second error output terminal via which a second error signal is outputted, and a second clock input terminal, and the second circuit device includes a second clock signal generation circuit that generates a second clock signal, a second error signal generation circuit that generates the second error signal, and a second selection circuit that selects one of the second clock signal and a signal inputted via the second clock input terminal based on the second error signal and outputs the selected signal via the second clock output terminal. The first clock input terminal and the second clock input terminal are electrically connected to each other.

In the clock signal generator according to this application example, in the first oscillator, the first clock signal generated by the first clock signal generation circuit is switched to the signal inputted via the first clock input terminal or vice versa based on whether or not an error has occurred in the first oscillator. Similarly, in the second oscillator, the second clock signal generated by the second clock signal generation circuit is switched to the signal inputted via the second clock input terminal or vice versa based on whether or not an error has occurred in the second oscillator. The signal outputted via the second clock output terminal of the second oscillator is then inputted to the first clock input terminal of the first oscillator. The clock signal generator according to the present application example can therefore output the second clock signal generated by the second oscillator via the first clock output terminal of the first oscillator as long as the second oscillator acts normally even when an error occurs in the first oscillator. Further, the clock signal generator according to the present application example, in which the first oscillator and the second oscillator are connected to each other in series, requires no selection circuit that selects one of the first clock signal generated by the first oscillator and the second clock signal generated by the second oscillator. The clock signal generator according to the present application example can therefore be used to achieve a multiplexed system at a low cost.

Further, in the clock signal generator according to this application example, the second oscillator can be followed by and connected in series to a third oscillator. Therefore, even when abnormality occurs in each of the first and second oscillators, a third clock signal generated by the third oscillator can be outputted via the first clock output terminal of the first oscillator as along as the third oscillator acts normally. That is, the clock signal generator according to the present application example excels also in expandability.

APPLICATION EXAMPLE 8

In the clock signal generator according to the application example described above, the first oscillator may include a first control terminal to which a first control signal that controls signal output via the first clock output terminal is inputted, the second oscillator may include a second control terminal to which a second control signal that controls signal output via the second clock output terminal is inputted, and the first error output terminal and the second control terminal may be electrically connected to each other.

The clock signal generator according to this application example can control the signal output via the first clock output terminal in accordance with the first control signal inputted via the first control terminal of the first oscillator. Further, the clock signal generator according to the present application example, in which the first error signal outputted via the first error output terminal of the first oscillator is inputted to the second control terminal of the second oscillator, can stop outputting the second clock signal via the second clock output terminal of the second oscillator until an error occurs in the first oscillator to reduce the electric power consumed by the second oscillator, and when an error occurs in the first oscillator, the second clock signal generated by the second oscillator can be outputted via the first clock output terminal of the first oscillator. The present application example can therefore provide a clock signal generator that excels in user convenience.

APPLICATION EXAMPLE 9

In the clock signal generator according to the application example described above, the first error output terminal and the second error output terminal may each be a CMOS output terminal.

This application example enables to configure a system that includes, for example, a host including a clock input terminal, a first error input terminal, and a second error input terminal and the clock signal generator according to the preset application example, in which the clock input terminal of the host is electrically connected to the first clock output terminal of the first oscillator, the first error input terminal of the host is electrically connected to the first error output terminal of the first oscillator, and the second error input terminal of the host is electrically connected to the second error output terminal of the second oscillator. In the system, the host can evaluate whether the first oscillator acts normally or abnormally based on whether the first error signal inputted via the first error input terminal has a low level or a high level and evaluate whether the second oscillator acts normally or abnormally based on whether the second error signal inputted via the second error input terminal has the low level or the high level.

APPLICATION EXAMPLE 10

In the clock signal generator according to the application example described above, the first error output terminal and the second error output terminal may each be an open-drain output terminal.

This application example enables to configure a system that includes, for example, a host including a clock input terminal and an error input terminal and the clock signal generator according to the present application example, in which the clock input terminal of the host is electrically connected to the first clock output terminal of the first oscillator, the error input terminal of the host is electrically connected to the first error output terminal of the first oscillator and the second error output terminal of the second oscillator, and the error input terminal of the host is electrically connected to a pulldown resistor or a pullup resistor. For example, in the system, the host can evaluate whether at least one of the first and second oscillators acts abnormally or both the first and second oscillators act normally based on whether the signal inputted via the error input terminal has the low level or the high level.

APPLICATION EXAMPLE 11

An electronic apparatus according to this application example includes any of the clock signal generators described above and a display section that displays an error based on the first error signal and the second error signal.

APPLICATION EXAMPLE 12

A vehicle according to this application example includes any of the clock signal generators described above.

The application examples described above allow achievement of a more reliable electronic apparatus and vehicle including the clock signal generator including a plurality of multiplexed oscillators.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferable embodiment of the invention will be described below in detail with reference to the drawings. The embodiment described below is not intended to unduly limit the contents of the invention set forth in the appended claims. Further, all configurations described below are not necessarily essential configuration requirements of the invention.

1. Oscillator

Structure of Oscillator

Figure 1:
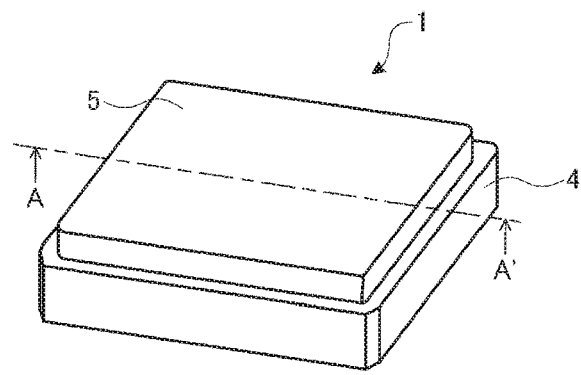
FIG. 1 is a perspective view of an oscillator according to an embodiment of the invention.
Figure 2:
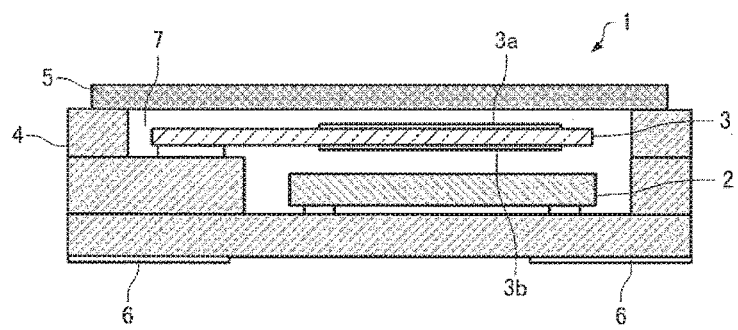
FIG. 2 is a cross-sectional view of the oscillator according to the embodiment.
Figure 3:
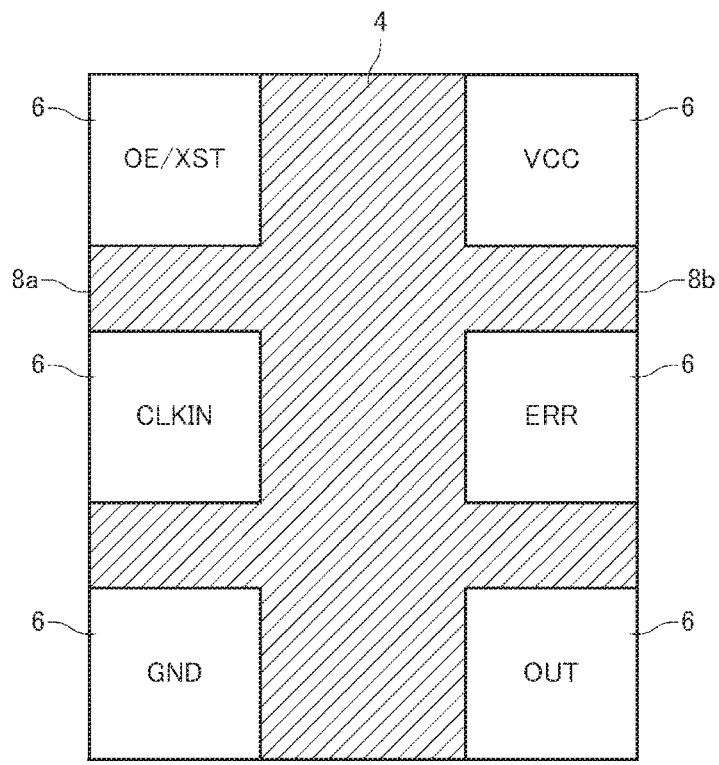
FIG. 3 is a bottom view of the oscillator according to the embodiment.

FIGS. 1 to 3 show an example of the structure of an oscillator 1 according to the present embodiment. FIG. 1 is a perspective view of the oscillator 1. FIG. 2 is a cross-sectional view taken along the line A-A' in FIG. 1. FIG. 3 is a bottom view of the oscillator 1.

The oscillator 1 includes an oscillation IC (integrated circuit) 2, which is a circuit device, a resonator 3, external terminals (external electrodes) 6 and further includes a package 4, a lid 5, and other components, as shown in FIGS. 1 to 3. In the present embodiment, the resonator 3 is a quartz crystal resonator using quartz crystal as the substrate material, for example, an AT cut quartz crystal resonator or a tuning fork type quartz crystal resonator. The resonator 3 may instead, for example, be a surface acoustic wave (SAW) resonator, any other piezoelectric resonator, or a micro electro mechanical system (MEMS) resonator. Further, the substrate material of the resonator 3 may, for example, be quartz crystal, lithium tantalate, lithium niobate, or any other piezoelectric single crystal, a piezoelectric material, such as lead zirconium titanate or any other piezoelectric ceramic material, or a silicon semiconductor material. The resonator 3 may be excited by using a piezoelectric effect or may be electrostatically driven based on Coulomb force.

The package 4 accommodates the oscillation IC 2 and the resonator 3 in the same space. Specifically, the package 4 is provided with a recessed portion, and the recessed portion covered with the lid 5 forms an accommodation chamber 7. In the package 4 or on the surface of the recessed portion are provided wiring lines that are not shown but electrically connect two terminals (terminals T7 and T8 in FIG. 4, which will be described later) of the oscillation IC 2 to two electrodes (excitation electrodes 3a and 3b) of the resonator 3. Further, in the package 4 or on the surface of the recessed portion are provided wiring lines that are not shown but electrically connect the terminals of the oscillation IC 2 to the corresponding external terminals 6. The package 4 does not necessarily have the configuration in which the oscillation IC 2 and the resonator 3 are accommodated in the same space. For example, the package 4 may be what is called an H-shaped package in which the oscillation IC 2 is mounted on one surface of a substrate of the package and the resonator 3 is mounted on the other surface of the substrate.

The resonator 3 includes the excitation electrodes 3a and 3b made of a metal and disposed on the front and rear surfaces of the resonator 3, respectively, and oscillates at a desired frequency (frequency necessary for oscillator 1) according to the shape and mass of the resonator 3 including the excitation electrodes 3a and 3b.

The bottom surface of the resonator 3 (rear surface of package 4) is provided, as the external terminals 6, which are formed of six terminals, with a control terminal OE/XST, a clock input terminal CLKIN, a ground terminal GND, a power source terminal VCC, an error output terminal ERR, and a clock output terminal OUT, as shown in FIG. 3. The oscillator 1 (package 4) has a first edge 8a and a second edge 8b, which faces away from the first edge 8a. The control terminal OE/XST, the clock input terminal CLKIN, and the ground terminal GND are provided along the first edge 8a, and the power source terminal VCC, the error output terminal ERR, and the clock output terminal OUT are provided along the second edge 8b.

Functional Configuration of Oscillator

Figures 4, 5, 6:
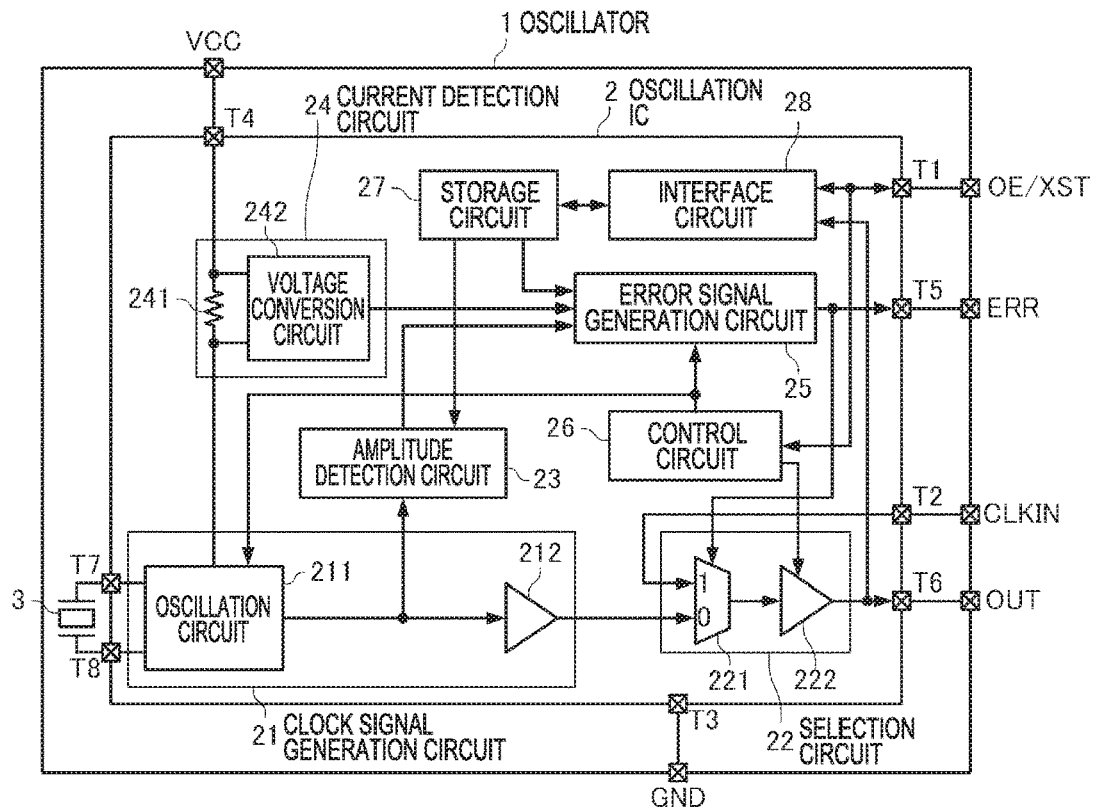
FIG. 4 is a functional block diagram of the oscillator according to the present embodiment.
FIG. 5 shows the relationship, in a case where an output stop function is selected, among the logical level of a signal via a control terminal, the oscillation state of an oscillation circuit, the logical level of a signal via an error output terminal, and a signal outputted via a clock output terminal.
FIG. 6 shows the relationship, in a case where a standby function is selected, among the logical level of a signal via a control terminal, the oscillation state of an oscillation circuit, the logical level of a signal via an error output terminal, and the signal outputted via a clock output terminal.

FIG. 4 is a functional block diagram of the oscillator 1 according to the present embodiment. The oscillator 1 according to the present embodiment includes the oscillation IC 2 and the resonator 3, as shown in FIG. 4. The oscillation IC 2 has eight terminals T1 to T8. The terminals T1 to T6 are electrically connected to the control terminal OE/XST, the clock input terminal CLKIN, the ground terminal GND, the power source terminal VCC, the error output terminal ERR, and the clock output terminal OUT of the oscillator 1, respectively. The terminal T7 is connected to one end (one terminal) of the resonator 3, and the terminal T8 is connected to the other end (other terminal) of the resonator 3.

In the present embodiment, the oscillation IC 2 includes a clock signal generation circuit 21, a selection circuit 22, an amplitude detection circuit 23, a current detection circuit 24, an error signal generation circuit 25, a control circuit 26, a storage circuit 27, and an interface circuit 28. The oscillation IC 2 may be so configured that part of the elements described above is omitted or changed or another element is added to the elements described above.

The clock signal generation circuit 21 generates a clock signal. In the present embodiment, the clock signal generation circuit 21 includes an oscillation circuit 211 and a buffer 212. The oscillation circuit 211, in which an amplification circuit (not shown) amplifies a signal outputted from the resonator 3 and inputted via the terminal T7 of the oscillation IC 2 and the amplified signal is fed back to the resonator 3 via the terminal T8 of the oscillation IC 2, causes the resonator 3 to oscillate and outputs an oscillation signal based on the oscillation of the resonator 3. In the present embodiment, the oscillation circuit 211 performs the action of causing the resonator to oscillate (oscillation action) when an oscillation stop signal outputted from the control circuit 26 is non-active (has low level, for example), whereas the oscillation circuit 211 stops the oscillation action when the oscillation stop signal is active (has high level signal, for example). The buffer 212 amplifies the oscillation signal outputted from the oscillation circuit 211 and outputs the amplified clock signal. That is, the oscillation signal outputted from the oscillation circuit 211 is a signal from which the clock signal is generated.

The selection circuit 22 selects, based on an error signal generated by the error signal generation circuit 25, one of the clock signal generated by the clock signal generation circuit 21 and a signal inputted via the clock input terminal CLKIN and the terminal T2 and outputs the selected signal out of the clock output terminal OUT via the terminal T6. In the present embodiment, the selection circuit 22 includes a multiplexer 221 and an output buffer 222. The multiplexer 221 selects and outputs the clock signal generated by the clock signal generation circuit 21 when the error signal has a low level, whereas the multiplexer 221 selects and outputs the signal inputted via the clock input terminal CLKIN and the terminal T2 when the error signal has a high level. The output buffer 222 buffers the signal outputted from the multiplexer 221 and outputs the buffered signal via the clock output terminal OUT when an output enable signal outputted from the control circuit 26 is active (has high level, for example), whereas the output buffer 222 outputs a low-level signal when the output enable signal is non-active (has low level, for example).

The amplitude detection circuit 23 detects the amplitude of the oscillation signal outputted from the oscillation circuit 211. For example, the amplitude detection circuit 23 may perform full-wave rectification on the oscillation signal outputted from the oscillation circuit 211 and integrate the signal having undergone the full-wave rectification to detect the amplitude of the oscillation signal.

The current detection circuit 24 detects the current flowing through the clock signal generation circuit 21. In the present embodiment, the current detection circuit 24 includes a resistor 241 and a voltage conversion circuit 242. The resistor 241 has one end electrically connected to the terminal T4 and the other end electrically connected to the oscillation circuit 211. The voltage conversion circuit 242 outputs voltage corresponding to the difference in potential, which occurs when current flows through the resistor 241, between the opposite ends of the resistor 241.

The error signal generation circuit 25 generates the error signal which represents whether the oscillation action of the oscillator 1 is normal or abnormal. In the present embodiment, the error signal generation circuit 25 generates the error signal based on the result of the detection performed by the amplitude detection circuit 23. Specifically, the error signal generation circuit 25 compares the voltage of the signal outputted from the amplitude detection circuit 23 (result of detection) with a predetermined threshold VT1 and generates the error signal based on the result of the comparison. For example, the error signal generation circuit 25 may generate a non-active (low-level, for example) error signal representing that the oscillation action is normal when the voltage of the signal outputted from the amplitude detection circuit 23 is greater than or equal to the threshold VT1, whereas the error signal generation circuit 25 may generate an active (high-level, for example) error signal representing that the oscillation action is abnormal when the voltage of the signal outputted from the amplitude detection circuit 23 is smaller than the threshold VT1. When the amplitude of the oscillation signal outputted from the oscillation circuit 211 is smaller than a logical threshold (50% of power source voltage, for example) of the buffer 212, the signal outputted from the buffer 212 is fixed at the low level, so that no clock signal is outputted via the clock output terminal OUT. For example, the threshold VT1 may be so set that the active error signal is generated before no clock signal is outputted via the clock output terminal OUT even when the output enable signal outputted from the control circuit 26 is active. In the present embodiment, the threshold VT1 can be set in the storage circuit 27 via a component external to the oscillator 1, so that the threshold VT1 is variable.

The error signal generation circuit 25 generates the error signal based further on the result of the detection performed by the current detection circuit 24 and outputs the generated error signal out of the error output terminal ERR via the terminal T5. Specifically, the error signal generation circuit 25 compares the voltage of the signal outputted from the current detection circuit 24 (result of detection) with a predetermined lower limit threshold VT2 and an upper limit threshold VT3 and generates the error signal based on the result of the comparison. For example, the error signal generation circuit 25 may generate the non-active error signal when the voltage of the signal outputted from the current detection circuit 24 is greater than or equal to the lower limit threshold VT2 but smaller than or equal to the upper limit threshold VT3, whereas the error signal generation circuit 25 may generate the active error signal when the voltage of the signal outputted from the current detection circuit 24 is smaller than the lower limit threshold VT2 or greater than the upper limit threshold VT3. The oscillation circuit 211 performs the oscillation action while consuming the current flowing via the power source terminal VCC through the resistor 241, and the consumed current varies in some cases when the oscillation action is unstable. For example, the lower limit threshold VT2 and the upper limit threshold VT3 may be so set that the active error signal is generated before an unstable clock signal is outputted via the clock output terminal OUT when the output enable signal outputted from the control circuit 26 is active. In the present embodiment, the lower limit threshold VT2 and the upper limit threshold VT3 can be set in the storage circuit 27 via a component external to the oscillator 1, so that the lower limit threshold VT2 and the upper limit threshold VT3 are variable.

As described above, the error signal generation circuit 25 generates the active error signal when the voltage of the signal outputted from the amplitude detection circuit 23 is smaller than the threshold VT1 or the voltage of the signal outputted from the current detection circuit 24 is smaller than the lower limit threshold VT2 or greater than the upper limit threshold VT3. The error signal generation circuit 25 performs the error signal generation action when the oscillation stop signal outputted from the control circuit 26 is non-active (has low level, for example) and does not perform the error signal generation action signal when the oscillation stop signal is active (has high level, for example) (signal via error output terminal ERR is fixed to low level).

The oscillator 1 can select one of an output stop function of selecting whether or not the clock signal is outputted via the clock output terminal OUT in accordance with the logical level of a control signal inputted via the control terminal OE/XST with the oscillation circuit 211 performing the oscillation action and a standby function of selecting whether or not the oscillation circuit 211 stops the oscillation action in accordance with the logical level of the control signal inputted via the control terminal OE/XST. In the present embodiment, the selection of the output stop function or the standby function can be set in the storage circuit 27 via a component external to the oscillator 1.

When the output stop function is selected, the control circuit 26 generates and outputs the output enable signal, which controls whether or not the output buffer 222 is allowed to output the clock signal, based on the control signal inputted via the control terminal OE/XST and the terminal T1. Specifically, the control circuit 26 outputs the non-active output enable signal when the control signal inputted via the control terminal OE/XST has the low level, whereas the control circuit 26 outputs the active output enable signal when the control signal has the high level. When the standby function is selected, the control circuit 26 generates and outputs the oscillation stop signal, which controls whether or not the oscillation circuit 211 stops the oscillation action, based on the control signal inputted via the control terminal OE/XST and the terminal T1. Specifically, the control circuit 26 outputs the active oscillation stop signal when the control signal inputted via the control terminal OE/XST has the low level, whereas the control circuit 26 outputs the non-active oscillation stop signal when the control signal has the high level.

The interface circuit 28 is a circuit for communication between the oscillator 1 and an external apparatus. For example, in a case where a predetermined pattern signal is inputted via the control terminal OE/XST (terminal T1) of the oscillator 1 after the supply of the power source voltage to the power source terminal VCC (terminal T4) starts but before a predetermined period elapses (that is, after power-on operation before predetermined period elapses), the operation mode of the oscillator 1 (oscillation IC 2) is set to be an external communication mode that allows communication between the interface circuit 28 and the external apparatus after the predetermined period elapses. The interface circuit 28 is, for example, an interface circuit for an inter-integrated circuit ($I^2C$) bus. In the external communication mode, the control terminal OE/XST functions as a terminal to which a serial clock signal is inputted, and the clock output terminal OUT functions as a terminal via which a serial data signal is inputted and outputted. In the external communication mode, the interface circuit 28 writes and reads a variety of pieces of information to and from the storage circuit 27 in accordance with a request (command) from the external apparatus.

The storage circuit 27 includes a resister and a nonvolatile memory (not shown), such as a MONOS (metal oxide nitride oxide silicon) memory and an EEPROM (electrically erasable programmable read-only memory). The threshold VT1, the lower limit threshold VT2, the upper limit threshold VT3, and the output stop function/standby function selection information described above are stored in the nonvolatile memory, for example, in the step of inspecting the oscillator 1. The variety of pieces of information stored in the nonvolatile memory are saved in the resister at the time of the power-on operation, and the variety of pieces of information saved in the resister are supplied to the circuits described above as appropriate.

Action of Oscillator

FIG. 5 shows the relationship, in the case where the output stop function is selected, among the logical level of the signal via the control terminal OE/XST that functions as the control terminal OE, the oscillation state of the oscillation circuit 211, the logical level of the signal via the error output terminal ERR, and the signal outputted via the clock output terminal.

In the case where the signal via the control terminal OE/XST has the low level, the signal via the clock output terminal OUT has the low level irrespective of the oscillation state of the oscillation circuit 211, normal or abnormal, as shown in FIG. 5. In the case where the signal via the control terminal OE/XST has the low level, and when the oscillation state of the oscillation circuit 211 is normal (the voltage of the signal outputted from the amplitude detection circuit 23 is greater than or equal to the threshold VT1, and the voltage of the signal outputted from the current detection circuit 24 is greater than or equal to the lower limit threshold VT2 and smaller than or equal to the upper limit threshold VT3), the signal via the error output terminal ERR has the low level, whereas when the oscillation state of the oscillation circuit 211 is abnormal (the voltage of the signal outputted from the amplitude detection circuit 23 is smaller than the threshold VT1 or the voltage of the signal outputted from the current detection circuit 24 is smaller than the lower limit threshold VT2 or greater than the upper limit threshold VT3), the signal via the error output terminal ERR has the high level.

In the case where the signal via the control terminal OE/XST has the high level, and when the oscillation state of the oscillation circuit 211 is normal, the signal via the error output terminal ERR has the low level, and the clock signal generated by the clock signal generation circuit 21 is outputted via the clock output terminal OUT. In the case where the signal via the control terminal OE/XST has the high level, and when the oscillation state of the oscillation circuit 211 is abnormal, the signal via the error output terminal ERR has the high level, and the signal inputted via the clock input terminal CLKIN is outputted via the clock output terminal OUT.

FIG. 6 shows the relationship, in the case where the standby function is selected, among the logical level of the signal via the control terminal OE/XST that functions as the control terminal XST, the oscillation state of the oscillation circuit 211, the logical level of the signal via the error output terminal ERR, and the signal outputted via the clock output terminal.

In the case where the signal via the control terminal OE/XST has the low level, the signal via the error output terminal ERR has the low level and the signal via the clock output terminal OUT has the low level irrespective of the oscillation state of the oscillation circuit 211, normal or abnormal, as shown in FIG. 6.

In the case where the signal via the control terminal OE/XST has the high level, and when the oscillation state of the oscillation circuit 211 is normal, the signal via the error output terminal ERR has the low level, and the clock signal generated by the clock signal generation circuit 21 is outputted via the clock output terminal OUT. In the case where the signal via the control terminal OE/XST has the high level, and when the oscillation state of the oscillation circuit 211 is abnormal, the signal via the error output terminal ERR has the high level, and the signal inputted via the clock input terminal CLKIN is outputted via the clock output terminal OUT.

Both in the case where the output stop function is selected and in the case where the standby function is selected, when the signal via the control terminal OE/XST has the low level, no signal (clock signal or signal inputted via clock input terminal CLKIN) is outputted via the clock output terminal OUT, whereas when the signal via the control terminal OE/XST has the high level, the clock signal or the signal inputted via the clock input terminal CLKIN is outputted the clock output terminal OUT, as shown in FIGS. 5 and 6. That is, a control signal that controls signal output via the clock output terminal OUT is inputted via the control terminal OE/XST.

Both in the case where the output stop function is selected and in the case where the standby function is selected, when the signal via the control terminal OE/XST has the high level, the oscillation circuit 211 performs the oscillation action, and the error signal generation circuit 25 performs the action of generating an error signal, so that the low-level or high-level error signal is outputted via the error output terminal ERR. In the case where the output stop function is selected, an error signal is outputted via the error output terminal ERR even when the signal via the control terminal OE/XST has the low level, whereas in the case where the standby function is selected, the oscillation circuit 211 stops the oscillation action, and the error signal generation circuit 25 stops the action of generating an error signal, so that the signal level at the error output terminal ERR is fixed to the low level and no error signal is outputted.

Advantageous Effects of Present Embodiment

As described above, the clock signal generated by the clock signal generation circuit 21 is switched to the signal inputted via the clock input terminal CLKIN or vice versa in accordance with whether or not the oscillation action of the oscillation circuit 211 is abnormal. Further, in the oscillator 1 according to the present embodiment, the signal output via the clock output terminal OUT is controlled in accordance with the control signal inputted via the control terminal OE/XST. Therefore, for example, using two oscillators 1 according to the present embodiment to electrically connect the clock input terminal CLKIN of the first oscillator 1 to the clock output terminal OUT of the second oscillator 1 and electrically connecting the error output terminal ERR of the first oscillator 1 to the control terminal OE/XST of the second oscillator 1 allows the following apparatus to be achieved: No clock signal is outputted via the clock output terminal OUT of the second oscillator 1 until abnormality occurs in the first oscillator 1 to reduce electric power consumed by the second oscillator 1; and the clock signal generated by the second oscillator 1 is outputted via the clock output terminal OUT of the first oscillator 1 when abnormality occurs in the first oscillator 1. As described above, according to the present embodiment, an oscillator 1 that can be multiplexed and excels in user convenience can be provided.

Further, the oscillator 1 according to the present embodiment can sense abnormality in the clock signal generation circuit 21 based on the amplitude of the oscillation signal outputted by the oscillation circuit 211 and the current flowing through the clock signal generation circuit 21 and automatically switch the signal outputted via the clock output terminal OUT to another. Moreover, the oscillator 1 according to the present embodiment, which can adjust the thresholds VT1, VT2, and VT3 set in the storage circuit 27 in accordance with the characteristics of the oscillation circuit 211, can accurately sense abnormality in the clock signal generation circuit 21 to switch the signal outputted via the clock output terminal OUT to another.

Further, the oscillator 1 according to the present embodiment, in which the clock input terminal CLKIN and the clock output terminal OUT are provided in positions separate from each other, can lower the probability of a short circuit between the clock input terminal CLKIN and the clock output terminal OUT due, for example, to entry of foreign matter. The oscillator 1 according to the present embodiment can therefore suppress concern of formation of a loop along which the signal outputted via the clock output terminal OUT returns via the clock input terminal CLKIN followed by output of a wrong signal via the clock output terminal OUT.

Variations

For example, in the embodiment described above, the error signal generation circuit 25 generates an error signal based on both the result of the detection performed by the amplitude detection circuit 23 and the result of the detection performed by the current detection circuit 24. The error signal generation circuit 25 may instead generate an error signal based only on one of the result of the detection performed by the amplitude detection circuit 23 and the result of the detection performed by the current detection circuit 24. That is, the oscillator 1 (oscillation IC 2) may include only one of the amplitude detection circuit 23 and the current detection circuit 24 and may not include the other one of the amplitude detection circuit 23 and the current detection circuit 24.

Further, for example, the threshold VT1, the lower limit threshold VT2, the upper limit threshold VT3, and the output stop function/standby function selection information are stored and therefore variably set in the storage circuit 27 (nonvolatile memory) in the embodiment described above, but a fuse circuit may be so provided that the threshold VT1, the lower limit threshold VT2, the upper limit threshold VT3, and the selection information are each variably set. Further, the oscillator 1 may include discrete circuit components instead of the oscillation IC 2, or in addition to the oscillation IC 2.

Further, for example, the oscillator 1 according to the embodiment described above is a simple oscillator that performs no temperature compensation or temperature control (such as simple packaged crystal oscillator: SPXO) and may instead, for example, be an oscillator having a temperature compensation function (such as temperature compensated crystal oscillator: TCXO), an oscillator having a temperature control function (such as oven controlled crystal oscillator: OCXO), or an oscillator having a frequency control function (such as voltage controlled crystal oscillator: VCXO).

2. Clock Signal Generator

Figure 7:
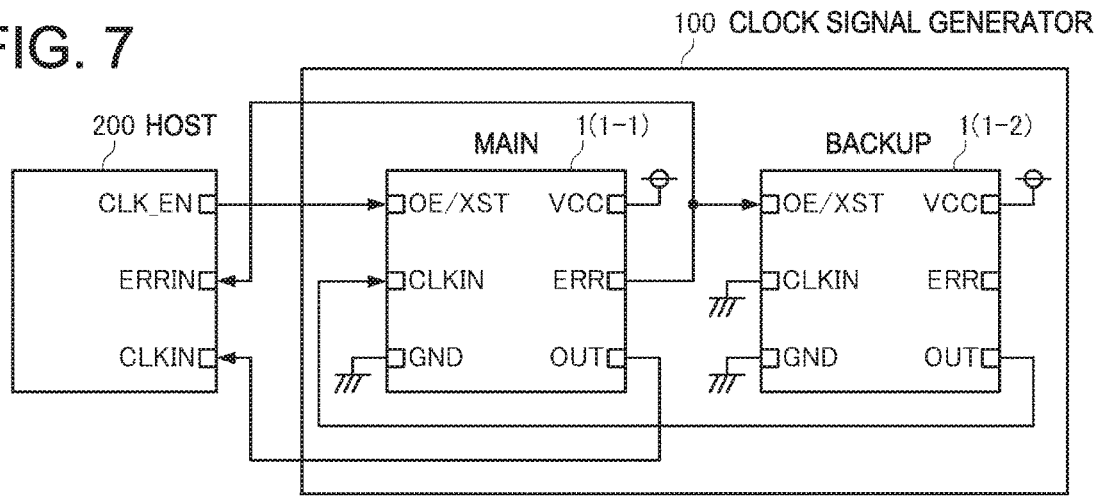
FIG. 7 shows an example of the configuration of a multiplexed system including a clock signal generator according to the present embodiment and a host.

FIG. 7 shows an example of the configuration of a multiplexed system including a clock signal generator 100 according to the present embodiment and a host 200. The clock signal generator 100 according to the present embodiment includes a main oscillator 1-1 and a backup oscillator 1-2, as shown in FIG. 7. In the present embodiment, the oscillator 1 according to the embodiment described above or any of the variations thereof is used as each of the two oscillators 1-1 and 1-2.

That is, the oscillator 1-1 (example of "first oscillator") includes the control terminal OE/XST (example of "first control terminal"), the clock input terminal CLKIN (example of "first clock input terminal"), the ground terminal GND, the power source terminal VCC, the error output terminal ERR (example of "first error output terminal"), and the clock output terminal OUT (example of "first clock output terminal") as the six external terminals 6 (see FIG. 3). A control signal that controls signal output via the clock output terminal OUT (example of "first control signal") is inputted to the control terminal OE/XST. The error output terminal ERR outputs an error signal generated in the oscillator 1-1 (example of "first error signal"). One of the clock signal generated in the oscillator 1-1 (example of "first clock signal") and a signal inputted via the clock input terminal CLKIN is selected based on the error signal and outputted via the clock output terminal OUT.

Similarly, the oscillator 1-2 (example of "second oscillator") includes the control terminal OE/XST (example of "second control terminal"), the clock input terminal CLKIN (example of "second clock input terminal"), the ground terminal GND, the power source terminal VCC, the error output terminal ERR (example of "second error output terminal"), and the clock output terminal OUT (example of "second clock output terminal") as the six external terminals 6 (see FIG. 3). A control signal that controls signal output via the clock output terminal OUT (example of "second control signal") is inputted to the control terminal OE/XST. The error output terminal ERR outputs an error signal generated in the oscillator 1-2 (example of "second error signal"). One of the clock signal generated in the oscillator 1-2 (example of "second clock signal") and a signal inputted via the clock input terminal CLKIN is selected based on the error signal and outputted via the clock output terminal OUT.

The error output terminal ERR of each of the oscillators 1-1 and 1-2 is a CMOS output terminal and outputs a high-level or low-level error signal.

A power source is connected to the power source terminal VCC of each of the oscillators 1-1 and 1-2 and supplies the power source terminal VCC with predetermined power source voltage. The ground terminal GND of each of the oscillators 1-1 and 1-2 is grounded. The clock input terminal CLKIN of the oscillator 1-2 is also grounded. The clock input terminal CLKIN of the oscillator 1-1 and the clock output terminal OUT of the oscillator 1-2 are electrically connected to each other, and the error output terminal ERR of the oscillator 1-1 and the control terminal OE/XST of the oscillator 1-2 are electrically connected to each other. The error output terminal ERR of the oscillator 1-2 is open. Further, the control terminal OE/XST, the error output terminal ERR, and the clock output terminal OUT of the oscillator 1-1 are electrically connected to a clock enable terminal CLK_EN, an error input terminal ERRIN, and a clock input terminal CLKIN of the host 200, respectively.

Although not shown in FIG. 7, the oscillator 1-1 includes the oscillation IC 2 (example of "first circuit device") and the resonator 3, and the oscillation IC 2 includes the clock signal generation circuit 21 (example of "first clock signal generation circuit"), the selection circuit 22 (example of "first selection circuit"), the amplitude detection circuit 23, the current detection circuit 24, the error signal generation circuit 25 (example of "first error signal generation circuit"), the control circuit 26, the storage circuit 27, and the interface circuit 28 (see FIG. 4). Similarly, although not shown in FIG. 7, the oscillator 1-2 includes the oscillation IC 2 (example of "second circuit device") and the resonator 3, and the oscillation IC 2 includes the clock signal generation circuit 21 (example of "second clock signal generation circuit"), the selection circuit 22 (example of "second selection circuit"), the amplitude detection circuit 23, the current detection circuit 24, the error signal generation circuit 25

(example of "second error signal generation circuit"), the control circuit 26, the storage circuit 27, and the interface circuit 28 (see FIG. 4).

When the host 200 outputs the active (high-level, for example) clock enable signal via the clock enable terminal CLK_EN, the clock enable signal is inputted as an active control signal to the control terminal OE/XST of the oscillator 1-1. At this point, in the case where the oscillation action of the oscillator 1-1 is normal, the clock signal generated by the clock signal generation circuit 21 is outputted via the clock output terminal OUT of the oscillator 1-1. The clock signal is inputted via the clock input terminal CLKIN of the host 200 and used, for example, as a master clock signal in the host 200. In the case where the oscillator 1-1 acts normally, the non-active error signal is outputted via the error output terminal ERR of the oscillator 1-1, and the error signal is inputted as a non-active control signal to the control terminal OE/XST of the oscillator 1-2. Therefore, the oscillator 1-2, when the output stop function is selected, outputs no signal via the clock output terminal OUT, whereas when the standby function is selected, the oscillation circuit 211 (see FIG. 4) stops the oscillation action, and no signal is outputted via the clock output terminal OUT.

In the case where the active control signal (clock enable signal) is inputted to the control terminal OE/XST of the oscillator 1-1, and when the oscillation action of the oscillator 1-1 becomes abnormal, the active error signal is outputted via the error output terminal ERR of the oscillator 1-1, and the error signal is inputted as the active control signal to the control terminal OE/XST of the oscillator 1-2. Therefore, in the case where the oscillation action of the oscillator 1-2 is normal, the clock signal generated by the clock signal generation circuit 21 is outputted via the clock output terminal OUT of the oscillator 1-2 and supplied to the clock input terminal CLKIN of the oscillator 1-1. Since the oscillator 1-1 has generated and outputted the active error signal, the signal inputted to the clock input terminal CLKIN, that is, the clock signal outputted via the clock output terminal OUT of the oscillator 1-2 is outputted via the clock output terminal OUT of the oscillator 1-1.

As described above, when the host 200 outputs the active clock enable signal via the clock enable terminal CLK_EN, the clock signal generated by the oscillator 1-1 is inputted via the clock input terminal CLKIN of the host 200 in the case where the oscillation action of the oscillator 1-1 is normal, whereas the clock signal generated by the oscillator 1-2 is inputted via the clock input terminal CLKIN of the host 200 in the case where the oscillation action of the oscillator 1-1 is abnormal. The host 200 can therefore continue any action based on the clock signal inputted via the clock input terminal CLKIN, of course, in the case where the oscillation action of the oscillator 1-1 is normal and even in the case where the oscillation action of the oscillator 1-1 becomes abnormal. Further, since the error signal outputted via the error output terminal ERR of the oscillator 1-1 is supplied to the error input terminal ERRIN of the host 200, the host 200 can evaluate whether the oscillation action of the oscillator 1-1 is normal or abnormal based on the error signal. Specifically, the host 200 can determine that the oscillator 1-1 acts normally when the error signal inputted via the error input terminal ERRIN has the low level and that the oscillator 1-1 acts abnormally when the error signal has the high level. In the case where the oscillator 1-1 acts abnormally, the host 200 may then output information for prompting the user to exchange the oscillator 1-1 via a display section or a sound output section that is not shown.

Figure 8:
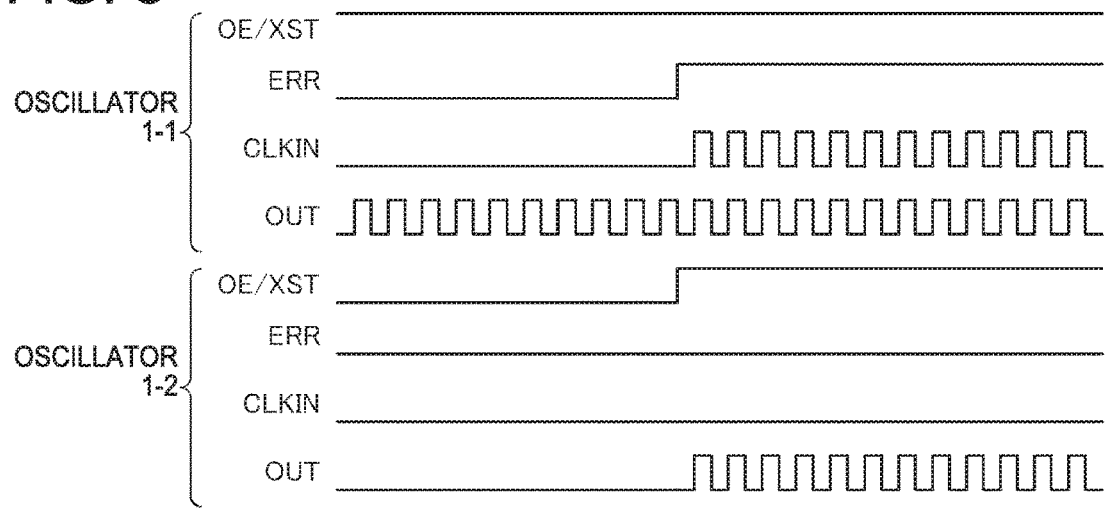
FIG. 8 shows an example of the waveforms of signals via terminals of the oscillator.
Figure 9:
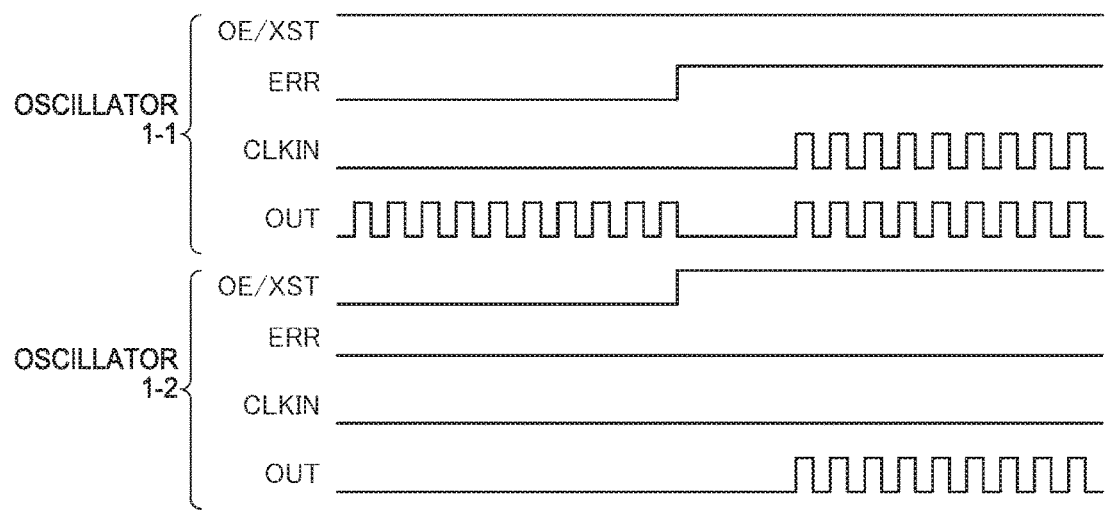
FIG. 9 shows another example of the waveforms of the signals via the terminals of the oscillator.

FIGS. 8 and 9 each show an example of the waveforms of the signals via the above-mentioned terminals of the oscillators 1-1 and 1-2 before and after the oscillation action of the oscillator 1-1 becomes abnormal when the host 200 outputs the active clock enable signal via the clock enable terminal CLK_EN. In FIG. 8, the output stop function is selected in the oscillator 1-2, and in FIG. 9, the standby function is selected in the oscillator 1-2. In the case where the output stop function is selected in the oscillator 1-2, since the oscillator 1-2 continues the oscillation action even in the case where the oscillation action of the oscillator 1-1 is normal, the pulses of the clock signal are continuously outputted without interruption via the clock output terminal OUT of the oscillator 1-1 before and after the oscillation action of the oscillator 1-1 becomes abnormal (level of signal via error output terminal of oscillator 1-1 changes from low level to high level), as shown in FIG. 8. It can therefore be said that a robust multiplexed system is formed. In contrast, in the case where the standby function is selected in the oscillator 1-2, since the oscillator 1-2 stops the oscillation action when the oscillation action of the oscillator 1-1 is normal, the power consumed by the oscillator 1-2 is greatly reduced although the pulses of the clock signal outputted via the clock output terminal OUT of the oscillator 1-1 are interrupted immediately after the oscillation action of the oscillator 1-1 becomes abnormal (level of signal via error output terminal of oscillator 1-1 changes from low level to high level), as shown in FIG. 9. Further, since the oscillator 1-2 stops the oscillation action while the oscillator 1-1 continues the normal oscillation action, the oscillator 1-2 is more unlikely to experience abnormality in the oscillation action due to aging than the oscillator 1-1. Therefore, when the oscillation action of the oscillator 1-1 becomes abnormal, the clock signal generated by the oscillator 1-2 is supplied with improved probability to the clock input terminal CLKIN of the host 200.

On the other hand, when the host 200 outputs the non-active (low-level, for example) clock enable signal via the clock enable terminal CLK_EN, the clock enable signal is inputted as the non-active control signal to the control terminal OE/XST of the oscillator 1-1. At this point, the oscillator 1-1 stops signal output via the clock output terminal OUT when the output stop function is selected, whereas the oscillator 1-1 stops the oscillation action of the oscillation circuit 211 (see FIG. 4) and further stops the signal output via the clock output terminal OUT when the standby function is selected. Further, the oscillator 1-1 outputs an error signal generated by the error signal generation circuit 25 via the error output terminal ERR when the output stop function is selected, whereas the error signal generation circuit 25 does not perform the action of generating an error signal and the level of the signal via the error output terminal ERR is fixed to the low level when the standby function is selected.

In the case where the output stop function is selected in the oscillator 1-1, and the host 200 then outputs the active clock enable signal via the clock enable terminal CLK_EN, the clock signal generated by the clock signal generation circuit 21 of the oscillator 1-1 is outputted via the clock output terminal OUT thereof and supplied to the clock input terminal CLKIN of the host 200 when the oscillation action of the oscillator 1-1 is normal. In contrast, when the non-active control signal (clock enable signal) is inputted to the control terminal OE/XST of the oscillator 1-1, and the oscillation action of the oscillator 1-1 becomes abnormal, the active error signal is outputted via the error output terminal ERR of the oscillator 1-1, and the error signal is inputted as the active control signal to the control terminal OE/XST of the oscillator 1-2. Therefore, when the oscillation action of the oscillator 1-2 is normal, the clock signal generated by the clock signal generation circuit 21 of the oscillator 1-2 is outputted via the clock output terminal OUT thereof and supplied to the clock input terminal CLKIN of the oscillator 1-1. Since the oscillator 1-1 has generated and outputted the active error signal, the signal inputted to the clock input terminal CLKIN of the oscillator 1-1, that is, the clock signal outputted via the clock output terminal OUT of the oscillator 1-2 is outputted via the clock output terminal OUT of the oscillator 1-1. Thereafter, when the host 200 outputs the active clock enable signal via the clock enable terminal CLK_EN, the signal inputted to the clock input terminal CLKIN of the oscillator 1-1, that is, the clock signal outputted via the clock output terminal OUT of the oscillator 1-2 is outputted via the clock output terminal OUT of the oscillator 1-2.

When the standby function is selected in the oscillator 1-1, and the host 200 then outputs the active clock enable signal via the clock enable terminal CLK_EN, the oscillation circuit 211 of the oscillator 1-1 starts the oscillation action. When the oscillation action is normal, the clock signal generated by the clock signal generation circuit 21 of the oscillator 1-1 is outputted via the clock output terminal OUT thereof and supplied to the clock input terminal CLKIN of the host 200. In contrast, when the non-active control signal (clock enable signal) is inputted to the control terminal OE/XST of the oscillator 1-1, and even when the oscillation action of the oscillator 1-1 becomes abnormal, the level of the signal via the error output terminal ERR of the oscillator 1-1 remains fixed to the low level. Thereafter, when the host 200 outputs the active clock enable signal via the clock enable terminal CLK_EN, the active control signal (clock enable signal) is inputted to the control terminal OE/XST of the oscillator 1-1, and the error signal generation circuit 25 generates the active error signal. As a result, the signal inputted to the clock input terminal CLKIN of the oscillator 1-1, that is, the signal (low-level signal) outputted via the clock output terminal OUT of the oscillator 1-2 is outputted via the clock output terminal OUT of the oscillator 1-1. At the same time, the active error signal is outputted via the error output terminal ERR of the oscillator 1-1 and inputted as the active control signal to the control terminal OE/XST of the oscillator 1-2. Therefore, when the oscillation action of the oscillator 1-2 is normal, the clock signal generated by the clock signal generation circuit 21 of the oscillator 1-2 is outputted via the clock output terminal OUT thereof and supplied to the clock input terminal CLKIN of the oscillator 1-1. As a result, the signal inputted to the clock input terminal CLKIN of the oscillator 1-1, that is, the clock signal outputted via the clock output terminal OUT of the oscillator 1-1 is outputted via the clock output terminal OUT of the oscillator 1-2.

As described above, after the host 200 changes the clock enable signal outputted via the clock enable terminal CLK_EN from the non-active signal to the active signal, the clock signal generated by the oscillator 1-1 is inputted via the clock input terminal CLKIN of the host 200 when the oscillation action of the oscillator 1-1 is normal, whereas the clock signal generated by the oscillator 1-2 is inputted via the clock input terminal CLKIN of the host 200 when the oscillation action of the oscillator 1-1 is abnormal. The host 200 can therefore continue any action based on the clock signal inputted via the clock input terminal CLKIN, of course, in the case where the oscillation action of the oscillator 1-1 is normal and even in the case where the oscillation action of the oscillator 1-1 becomes abnormal.

Figure 10:
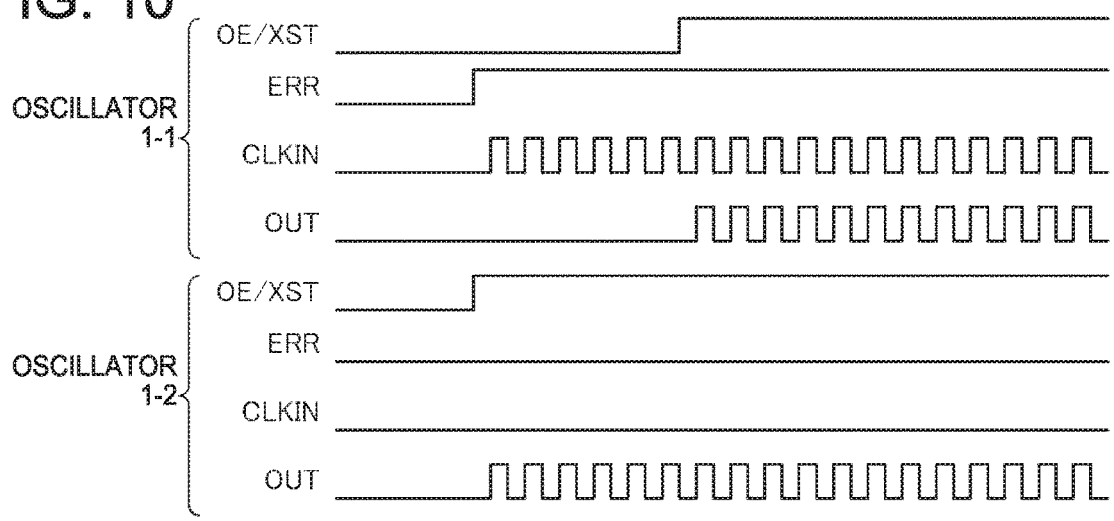
FIG. 10 shows another example of the waveforms of the signals via the terminals of the oscillator.
Figure 11:
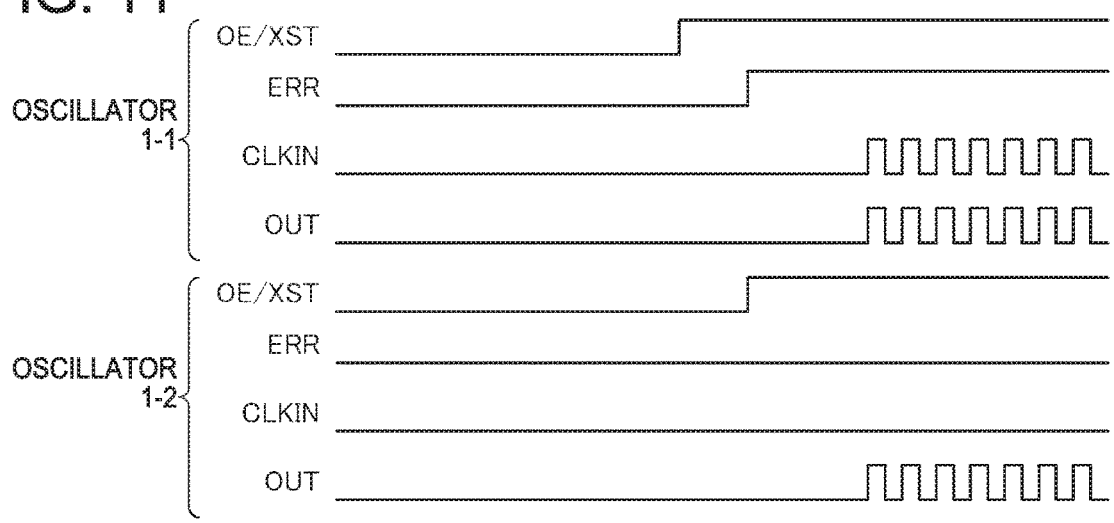
FIG. 11 shows another example of the waveforms of the signals via the terminals of the oscillator.

FIGS. 10 and 11 each show an example of the waveforms of the signals via the above-mentioned terminals of the oscillators 1-1 and 1-2 in a case where when the host 200 outputs the non-active clock enable signal via the clock enable terminal CLK_EN, the oscillation action of the oscillator 1-1 becomes abnormal and the host 200 then outputs the active clock enable signal via the clock enable terminal CLK_EN. In FIG. 10, the output stop function is selected in each of the oscillators 1-1 and 1-2, and in FIG. 11, the standby function is selected in each of the oscillators 1-1 and 1-2. In the case where the output stop function is selected in each of the oscillators 1-1 and 1-2, since the oscillator 1-2 continues the oscillation action, the oscillator 1-1 starts outputting the pulses of the clock signal via the clock output terminal OUT thereof immediately after the level of the signal from the error output terminal of the oscillator 1-1 changes from the low level to the high level, as shown in FIG. 10. It can therefore be said that a robust multiplexed system is formed. In contrast, in the case where the standby function is selected in each of the oscillators 1-1 and 1-2, and the signal via the control terminal OE/XST of the oscillator 1-1 has the low level, even when the oscillation action of the oscillator 1-1 becomes abnormal, the level of the signal via the error output terminal ERR of the oscillator 1-1 is fixed to the low level because the error signal generation circuit 25 of the oscillator 1-1 does not perform the action of generating an error signal. Thereafter, when the level of the signal via the control terminal OE/XST of the oscillator 1-1 changes from the low level to the high level, the error signal generation circuit 25 of the oscillator 1-1 performs the action of generating an error signal, and the level of the signal via the error output terminal of the oscillator 1-1 changes from the low level to the high level. The oscillator 1-2 therefore starts the oscillation action and starts outputting the pulses of the clock signal after a short period via the clock output terminal OUT of the oscillator 1-2. As a result, the oscillator 1-1 starts outputting the pluses of the clock signal via the clock output terminal OUT thereof. The oscillator 1-2 then stops the oscillation action while the oscillator 1-1 normally continues the oscillation action, whereby the electric power consumed by the oscillator 1-2 is greatly reduced, and the oscillator 1-2 is more unlikely to experience abnormality in the oscillation action due to aging than the oscillator 1-1. Therefore, when the oscillation action of the oscillator 1-1 becomes abnormal, the clock signal generated by the oscillator 1-2 is supplied with improved probability to the clock input terminal CLKIN of the host 200.

As described above, in the clock signal generator 100 according to the present embodiment, in each of the oscillators 1-1 and 1-2, the clock signal generated by the clock signal generation circuit 21 is switched to the signal inputted via the clock input terminal CLKIN or vice versa based on whether or not abnormality has occurred in the oscillator. The signal outputted via the clock output terminal OUT of the oscillator 1-2 is then inputted to the clock input terminal CLKIN of the oscillator 1-1. The clock signal generator 100 according to the present embodiment can therefore output the clock signal generated by the oscillator 1-2 via the clock output terminal OUT of the oscillator 1-1 as long as the oscillator 1-2 acts normally even when abnormality occurs in the oscillator 1-1. Further, the clock signal generator 100 according to the present embodiment, in which the oscillators 1-1 and 1-2 are connected to each other in series, requires no selection circuit that selects one of the clock signal generated by the oscillator 1-1 and the clock signal generated by the oscillator 1-2. The clock signal generator 100 according to the present embodiment can therefore be used to achieve a multiplexed system at a low cost.

Further, the clock signal generator 100 according to the present embodiment can control the signal output via the clock output terminal OUT of the oscillator 1-1 in accordance with a control signal inputted via the control terminal OE/XST thereof. Moreover, the clock signal generator 100 according to the present embodiment, in which an error signal outputted via the error output terminal ERR of the oscillator 1-1 is inputted to the control terminal OE/XST of the oscillator 1-2, can stop outputting the clock signal via the clock output terminal OUT of the oscillator 1-2 until abnormality occurs in the oscillator 1-1 to reduce the electric power consumed by the oscillator 1-2, and when an error occurs in the oscillator 1-1, the clock signal generated by the oscillator 1-2 can be outputted via the clock output terminal OUT of the oscillator 1-1. The present embodiment can therefore provide a clock signal generator 100 that excels in user convenience.

Further, in the clock signal generator 100 according to the present embodiment, the oscillator 1-2 can be followed by and connected in series to an oscillator 1-3. Therefore, even when abnormality occurs in each of the oscillators 1-1 and 1-2, the clock signal generated by the oscillator 1-3 can be outputted via the clock output terminal OUT of the oscillator 1-1 as along as the oscillator 1-3 acts normally. That is, the clock signal generator 100 according to the present embodiment excels also in expandability.

Figure 12:
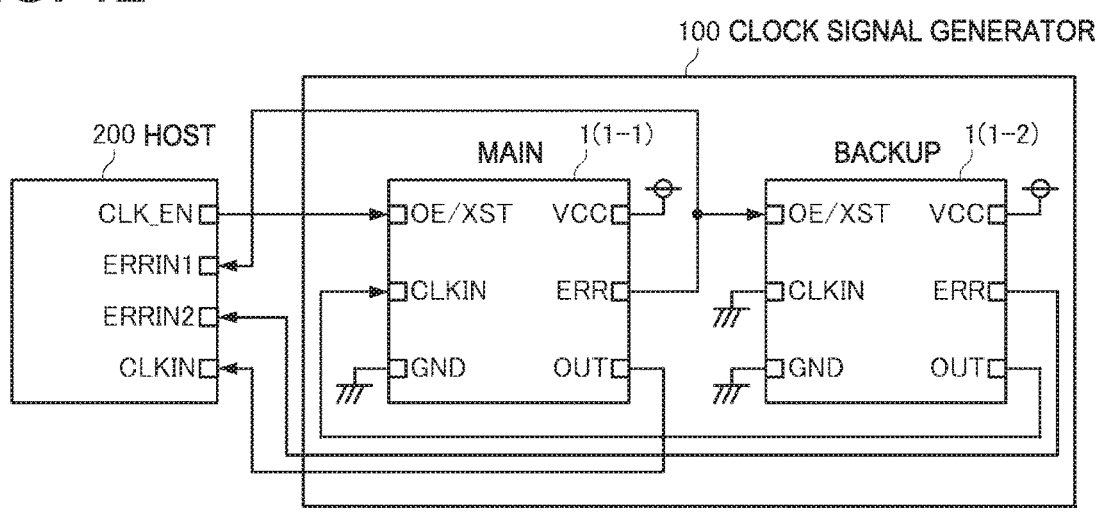
FIG. 12 shows another example of the configuration of the multiplexed system including the clock signal generator according to the present embodiment and the host.
Figure 13:
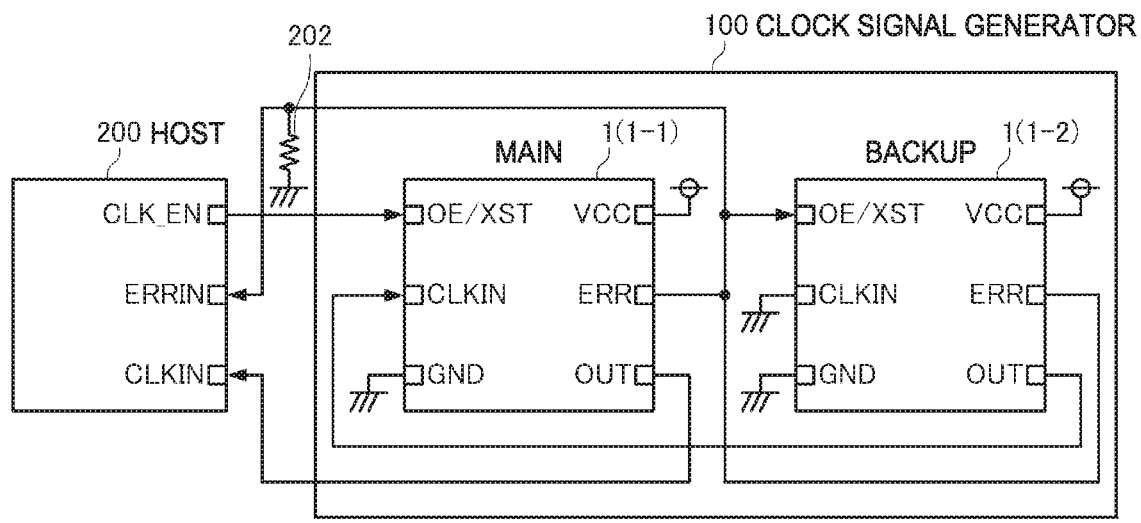
FIG. 13 shows another example of the configuration of the multiplexed system including the clock signal generator according to the present embodiment and the host.

FIGS. 12 and 13 each show another example of the configuration of the multiplexed system including the clock signal generator 100 according to the present embodiment and the host 200. In each of the examples shown in FIGS. 12 and 13, the clock signal generator 100 includes the main oscillator 1-1 and the backup oscillator 1-2, as in the example shown in FIG. 7, and the oscillator 1 according to the embodiment described above or any of the variations thereof is used as each of the two oscillators 1-1 and 1-2.

In the example shown in FIG. 12, the host 200 has two error input terminals ERRIN1 and ERRIN2, and the error output terminal ERR of the oscillator 1-1 and the error output terminal ERR of the oscillator 1-2 are electrically connected to the error input terminal ERRIN1 and the error input terminal ERRIN2 of the host 200, respectively. The other configurations in the example shown in FIG. 12 are the same as those in FIG. 7 and will therefore not be described. In the example shown in FIG. 12, since an error signal outputted via the error output terminal ERR of the oscillator 1-1 is supplied to the error input terminal ERRIN1 of the host 200, the host 200 can evaluate whether the oscillation action of the oscillator 1-1 is normal or abnormal based on the error signal. Further, since an error signal outputted via the error output terminal ERR of the oscillator 1-2 is supplied to the error input terminal ERRIN2 of the host 200, the host 200 can evaluate whether the oscillation action of the oscillator 1-2 is normal or abnormal based on the error signal. Specifically, the host 200 can determine that the oscillator 1-1 acts normally when the error signal inputted via the error input terminal ERRIN1 has the low level, whereas the host 200 can determine that the oscillator 1-1 acts abnormally when the error signal has the high level. Further, the host 200 can determine that the oscillator 1-2 acts normally when the error signal inputted via the error input terminal ERRIN2 has the low level, whereas the host 200 can determine that the oscillator 1-2 acts abnormally when the error signal has the high level. The host 200 may then output, via the display section or sound output section that is not shown, information for prompting the user to exchange the oscillator 1-1 when the oscillator 1-1 acts abnormally and information for prompting the user to exchange the oscillator 1-2 when the oscillator 1-2 acts abnormally.

In the example shown in FIG. 13, the host 200 has one error input terminal ERRIN, and the error output terminal ERR of the oscillator 1-1 and the error output terminal ERR of the oscillator 1-2 are electrically connected to the error input terminal ERRIN of the host 200 and grounded via a pulldown resistor 202. In each of the oscillators 1-1 and 1-2, the error signal generation circuit 25 is, for example, so configured that the high-level or low-level error signal is inputted to the gate of a P-channel MOS transistor and the drain of the P-channel MOS transistor is electrically connected to the error output terminal ERR (open-drain configuration of P-channel MOS transistor). That is, the error output terminal ERR of each of the oscillators 1-1 and 1-2 is an open-drain output terminal and outputs the high-level error signal or is open. When the error output terminals ERR of the oscillators 1-1 and 1-2 are both open, the low-level error signal is supplied to the error input terminal ERRIN of the host 200 via the pulldown resistor 202. The other configurations in the example shown in FIG. 13 are the same as those in FIG. 7 and will therefore not be described. In the example shown in FIG. 13, the host 200 can evaluate whether the oscillation actions of the oscillators 1-1 and 1-2 are normal or whether at least one of the oscillators 1-1 and 1-2 acts abnormally based on the error signal inputted via the error input terminal ERRIN. Specifically, the host 200 can determine that the oscillators 1-1 and 1-2 act normally when the error signal inputted via the error input terminal ERRIN has the low level, whereas the host 200 can determine that at least one of the oscillators 1-1 and 1-2 acts abnormally when the error signal has the high level. The host 200 may then output, via the display section or sound output section that is not shown, information for prompting the user to exchange the oscillators 1-1 and 1-2 when at least one of the oscillators 1-1 and 1-2 acts abnormally. Further, in the example shown in FIG. 13, the host 200 having one error input terminal ERRIN can be used, as in the example shown in FIG. 7.

In the examples shown in FIGS. 7, 12, and 13, the clock signal generator 100 is so configured that the two oscillators 1-1 and 1-2 are connected to each other in series, but the number of oscillators is not limited to two, and n (n2) oscillators 1-1 to 1-n may be sequentially connected to each other in series.

3. Electronic Apparatus

Figure 14:
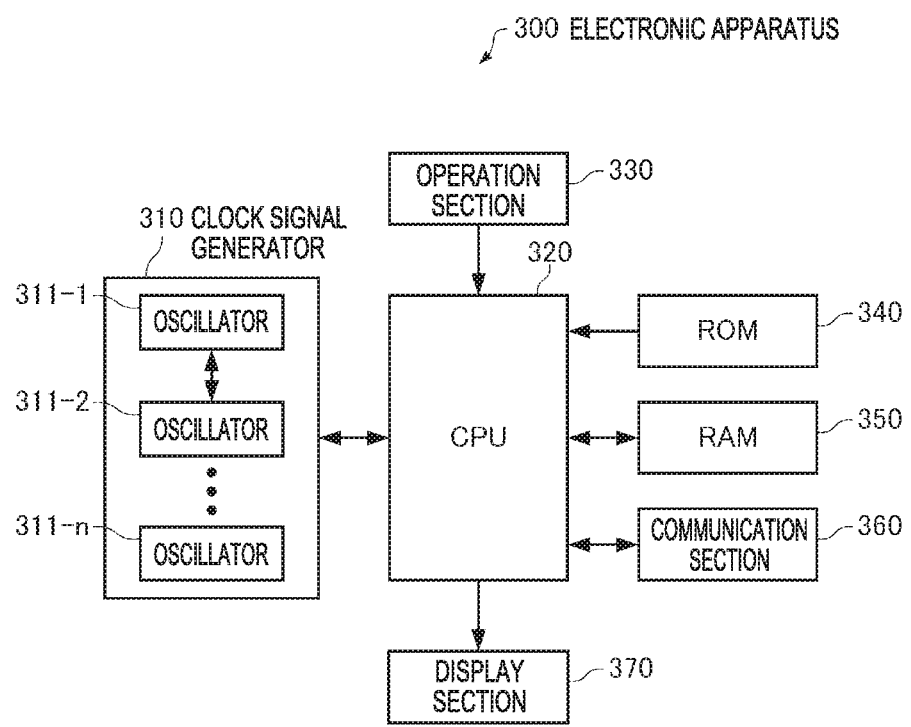
FIG. 14 is a functional block diagram of an electronic apparatus according to the present embodiment.
Figure 15:
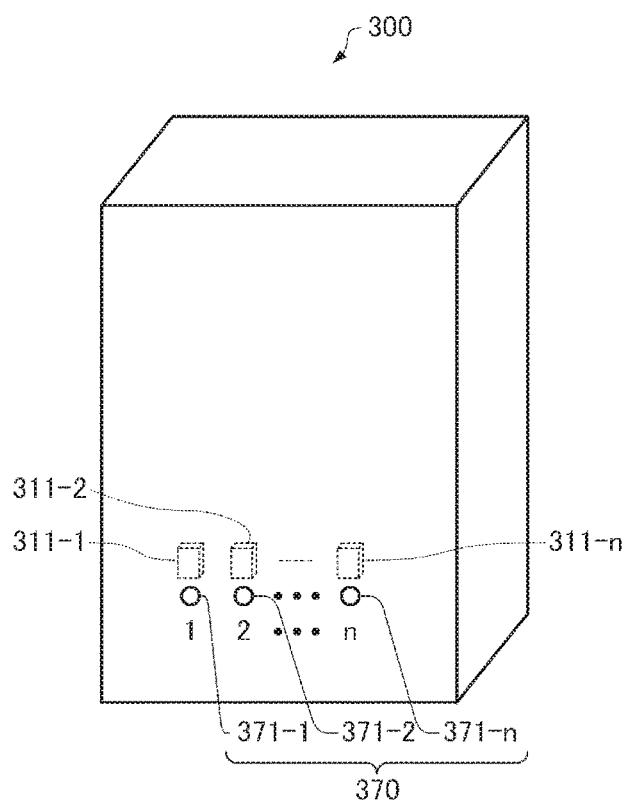
FIG. 15 shows an example of the exterior appearance of the electronic apparatus according to the present embodiment.

FIG. 14 is a functional block diagram showing an example of the configuration of an electronic apparatus according to the present embodiment. FIG. 15 shows an example of the exterior appearance of the electronic apparatus according to the present embodiment.

An electronic apparatus 300 according to the present embodiment includes a clock signal generator 310, a CPU (central processing unit) 320, an operation section 330, a ROM (read only memory) 340, a RAM (random access memory) 350, a communication section 360, and a display section 370. The electronic apparatus according to the present embodiment may be so configured that part of the components (portions) shown in FIG. 14 is omitted or changed or another component is added to the components described above.

The clock signal generator 310 includes n oscillators 311-1 to 311-n connected to each other in series. The oscillator 311-1 is a main oscillator, and the oscillators 311-2 to 311-n are backup oscillators. The clock signal outputted from the oscillator 311-1 is supplied to the CPU 320. In a case where the oscillator 311-1 acts abnormally, the clock signal outputted by one of the oscillators 311-2 to 311-n that act normally or the oscillator 311-k connected in series to and closest to the oscillator 311-1 is outputted from the oscillator 311-1 via the oscillators 311-(k-1) to 311-1 and supplied to the CPU 320. The oscillators 311-2 to 311-n each output an error signal representing that the oscillator acts normally or abnormally to the CPU 320.

The CPU 320 is a processor that carries out a variety of computation processes and control processes based on the clock signal inputted from the clock signal generator 310 in accordance with programs stored, for example, in the ROM 340. Specifically, the CPU 320 carries out the process of controlling the clock signal generator 310, a variety of processes according to an operation signal from the operation section 330, the process of controlling the communication section 360 for data communication with an external apparatus, the process of sending a display signal for displaying a variety of pieces of information on the display section 370, and other processes.

The operation section 330 is an input apparatus formed, for example, of operation keys and button switches and outputs an operation signal according to the user's operation to the CPU 320.

The ROM 340 is a storage that stores the programs that allow the CPU 320 to carry out the variety of computation processes and control processes, data, and other pieces of information.

The RAM 350 is a storage that is used as a work area for the CPU 320 and temporarily stores the program and data read from the ROM 340, data inputted via the operation section 330, results of computation performed by the CPU 320 in accordance with the variety of programs, and other pieces of information.

The communication section 360 performs a variety of types of control for establishing data communication between the CPU 320 and an external apparatus.

The display section 370 is a display apparatus formed, for example, of an LCD (liquid crystal display) and displays a variety of pieces of information based on a display signal inputted from the CPU 320. The display section 370 may be provided with a touch panel that functions as the operation section 330. The display section 370 may instead include LEDs (light emitting diodes) 371-1 to 371-n provided in correspondence with (for example, in positions close to) the oscillators 311-1 to 311-n. For example, the LEDs 371-i (i is any of 1 to n) emits no light when the oscillator 311-i acts normally whereas emitting light when the oscillator 311-i acts abnormally. The light emitted from each of the LEDs 371-1 to 371-n can be visually recognized at a location external to the electronic apparatus 300. That is, the thus configured display section 370 is intended to display an error based on an error signal outputted from any of the oscillators 311-1 to 311-n. The user of the electronic apparatus 300 can evaluate whether the oscillators 311-1 to 311-n each act normally or abnormally based on whether or not the corresponding one of the LEDs 371-1 to 371-n emits light and exchange an abnormally acting oscillator or otherwise take measures. Information for identifying the LEDs 371-1 to 371-n (1 to n in FIG. 15) may be printed on an enclosure of the electronic apparatus 300 in correspondence with the LEDs 371-1 to 371-n, as shown in FIG. 15.

The clock signal generator 100 according to the embodiment described above (clock signal generator 100 including n multiplexed oscillators 1-1 to 1-n) can, for example, be used as the clock signal generator 310. A reliable electronic apparatus can thus be achieved.

A variety of electronic apparatus are conceivable as the thus configured electronic apparatus 300 and may, for example, include a personal computer (mobile personal computer, laptop personal computer, and tablet personal computer, for example), a mobile terminal, such as a smartphone and a mobile phone, a digital camera, an inkjet-type liquid ejection apparatus (inkjet printer, for example), a storage area network apparatus, such as a router and a switch, a local area network apparatus, an apparatus for a mobile terminal base station, a television receiver, a video camcorder, a video recorder, a car navigator, a real-time clock apparatus, a pager, an electronic notepad (including electronic notepad having communication capability), an electronic dictionary, a desktop calculator, an electronic game console, a game controller, a word processor, a workstation, a TV phone, a security television monitor, electronic binoculars, a POS terminal, a medical apparatus (electronic thermometer, blood pressure gauge, blood sugar meter, electrocardiograph, ultrasonic diagnostic apparatus, and electronic endoscope, for example), a fish finder, a variety of measuring apparatus, a variety of instruments (instruments for car, airplane, and ship, for example), a flight simulator, a head mounted display, a motion tracer, a motion tracker, a motion controller, and pedestrian dead reckoning (PDR).

An example of the electronic apparatus 300 according to the present embodiment may include a transmission apparatus that uses the clock signal generator 310 described above as a reference signal source to function, for example, as an apparatus for terminal base station that communicates with a terminal via a wire or wirelessly. The clock signal generator 100 according to the embodiment described above, for example, can be used as the clock signal generator 310 to achieve an electronic apparatus 300 that can be used, for example, in a communication base station and is desired to have high frequency precision, high performance, and high reliability.

Another example of the electronic apparatus 300 according to the present embodiment may include a communication apparatus in which the communication section 360 receives an external clock signal and the CPU 320 (processor) includes a frequency control section that controls the frequency of the clock signal generator 310 based on the external clock signal and the output signal (internal clock signal) from the clock signal generator 310. The communication apparatus may, for example, be used in a backbone network apparatus, such as a stratum 3, and a femto-cell.

4. Vehicle

Figure 16:
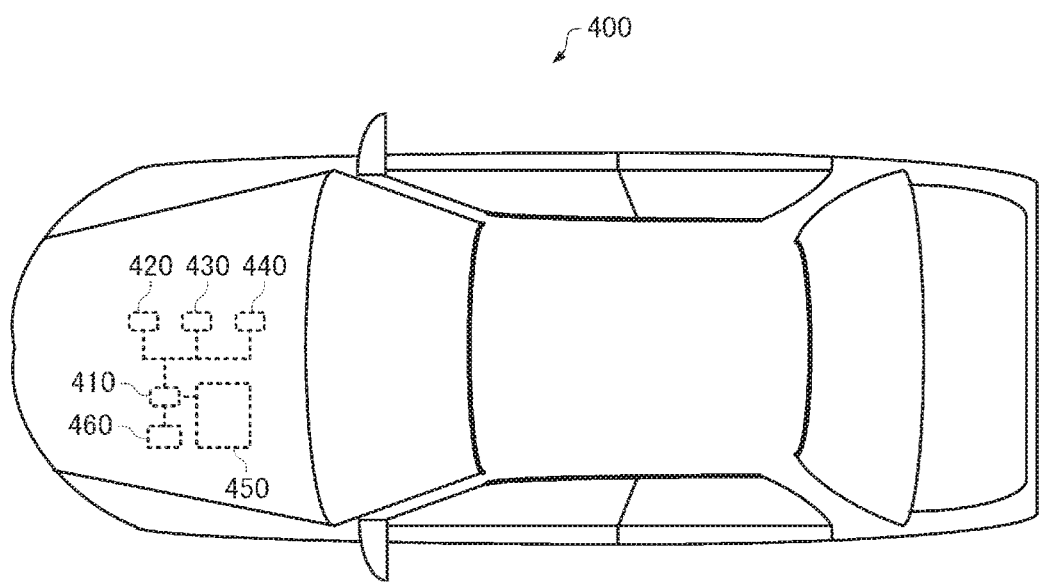
FIG. 16 shows an example of a vehicle according to the present embodiment.

FIG. 16 shows an example of a vehicle according to the present embodiment (top view). A vehicle 400 shown in FIG. 16 includes a clock signal generator 410, controllers 420, 430, and 440, which perform a variety of types of control, such as an engine system, a brake system, and a keyless entry system, a battery 450, and a backup battery 460. The vehicle according to the present embodiment may be so configured that part of the components (portions) shown in FIG. 16 is omitted or another component is added to the components described above.

The clock signal generator 410 includes n oscillators that are not shown but connected to each other in series. One of the n oscillators is a main oscillator, and the other n-1 oscillators are backup oscillators. The clock signal outputted from the main oscillator is supplied to the controllers 420, 430, and 440. In a case where the main oscillator acts abnormally, the clock signal outputted by one of the n-1 backup oscillators that act normally or the oscillator connected in series to and closest to the main oscillator is outputted from the main oscillator via the other oscillators and supplied to the CPU 320.

The battery 450 supplies the clock signal generator 410 and the controllers 420, 430, and 440 with electric power. The backup battery 460 supplies the clock signal generator 410 and the controllers 420, 430, and 440 with electric power when the voltage outputted from the battery 450 decreases to a value smaller than a threshold.

The clock signal generator 100 according to the embodiment described above (clock signal generator 100 including n multiplexed oscillators 1-1 to 1-*n*) can, for example, be used as the clock signal generator 410. A reliable vehicle can thus be achieved.

The thus configured moving object 400 is conceivably any of a variety of vehicles, for example, an automobile (including electric automobile), an airplane, such as a jet plane and a helicopter, a ship, a rocket, and an artificial satellite.

The invention is not limited to the present embodiment, and a variety of variations are conceivable to the extent that they fall within the substance of the invention.

The embodiment and the variations described above are presented by way of example, and the invention is not limited thereto. For example, the embodiment and any of the variations can be combined with each other as appropriate.

The invention encompasses substantially the same configuration as the configuration described in the embodiment (for example, a configuration having the same function, using the same method, and providing the same result or a configuration having the same purpose and providing the same effect). Further, the invention encompasses a configuration in which an inessential portion of the configuration described in the embodiment is replaced. Moreover, the invention encompasses a configuration that provides the same advantageous effect as that provided by the configuration described in the embodiment or a configuration that can achieve the same purpose as that achieved by the configuration described in the embodiment. Further, the invention encompasses a configuration in which a known technology is added to the configuration described in the embodiment.

The entire disclosure of Japanese Patent Application No. 2017-252089, filed Dec. 27, 2017 is expressly incorporated by reference herein.

What is claimed is:
1. An oscillator comprising:
a circuit device;
a clock output terminal;
an error output terminal via which an error signal is outputted; and
a clock input terminal,
wherein the circuit device includes
a clock signal generation circuit that generates a clock signal,
an error signal generation circuit that generates the error signal, and
a selection circuit that selects one of the clock signal and a signal inputted via the clock input terminal based on the error signal and outputs the selected signal via the clock output terminal.
2. The oscillator according to claim 1,
wherein the clock signal generation circuit includes an oscillation circuit that outputs an oscillation signal from which the clock signal is generated, the circuit device includes an amplitude detection circuit that detects an amplitude of the oscillation signal, and
the error signal generation circuit generates the error signal based on a result of the detection performed by the amplitude detection circuit.
3. The oscillator according to claim 2,
wherein the error signal generation circuit compares the result of the detection performed by the amplitude detection circuit with a threshold and generates the error signal based on a result of the comparison, and
the threshold is variable.
4. The oscillator according to claim 1,
wherein the circuit device includes a current detection circuit that detects current flowing through the clock signal generation circuit, and
the error signal generation circuit generates the error signal based on a result of the detection performed by the current detection circuit.
5. The oscillator according to claim 1, further comprising a control terminal to which a control signal that controls signal output via the clock output terminal is inputted.
6. The oscillator according to claim 1,
wherein the circuit device has a first edge and a second edge that faces away from the first edge,
the clock input terminal is provided along the first edge, and
the clock output terminal is provided along the second edge.
7. A clock signal generator comprising:
a first oscillator; and
a second oscillator,
wherein the first oscillator includes
a first circuit device,
a first clock output terminal,
a first error output terminal via which a first error signal is outputted, and
a first clock input terminal,
the first circuit device includes
a first clock signal generation circuit that generates a first clock signal,
a first error signal generation circuit that generates the first error signal, and
a first selection circuit that selects one of the first clock signal and a signal inputted via the first clock input terminal based on the first error signal and outputs the selected signal via the first clock output terminal,
the second oscillator includes
a second circuit device,
a second clock output terminal,
a second error output terminal via which a second error signal is outputted, and
a second clock input terminal,
the second circuit device includes
a second clock signal generation circuit that generates a second clock signal,
a second error signal generation circuit that generates the second error signal, and
a second selection circuit that selects one of the second clock signal and a signal inputted via the second clock input terminal based on the second error signal and outputs the selected signal via the second clock output terminal, and
the first clock input terminal and the second clock input output terminal are electrically connected to each other.

8. The clock signal generator according to claim 7,
wherein the first oscillator includes a first control terminal to which a first control signal that controls signal output via the first clock output terminal is inputted,
the second oscillator includes a second control terminal to which a second control signal that controls signal output via the second clock output terminal is inputted, and
the first error output terminal and the second control terminal are electrically connected to each other.

9. The clock signal generator according to claim 7, wherein the first error output terminal and the second error output terminal are each a CMOS output terminal.

10. The clock signal generator according to claim 7, wherein the first error output terminal and the second error output terminal are each an open-drain output terminal.

11. An electronic apparatus comprising:
the clock signal generator according to claim 7; and
a display section that displays an error based on the first error signal and the second error signal.

12. A vehicle comprising
the clock signal generator according to claim 7.

* * * * *